US011101632B2

(12) United States Patent
Al-Haddad

(10) Patent No.: US 11,101,632 B2
(45) Date of Patent: Aug. 24, 2021

(54) HIGH CURRENT DETECTION AND FIELD LOOP ISOLATION CIRCUIT

(71) Applicant: Saudi Arabian Oil Company, Dhahran (SA)

(72) Inventor: Ali Zaki Al-Haddad, Al-Qatif (SA)

(73) Assignee: Saudi Arabian Oil Company, Dhahran (SA)

( * ) Notice: Subject to any disclaimer, the term of this patent is extended or adjusted under 35 U.S.C. 154(b) by 23 days.

(21) Appl. No.: 16/681,349

(22) Filed: Nov. 12, 2019

(65) Prior Publication Data

US 2021/0143628 A1 May 13, 2021

(51) Int. Cl.
| H02H 3/00 | (2006.01) |
| H02H 3/04 | (2006.01) |
| G01R 31/52 | (2020.01) |
| H02H 1/00 | (2006.01) |
| H02H 3/02 | (2006.01) |
| H02H 3/08 | (2006.01) |

(52) U.S. Cl.
CPC ............... *H02H 3/04* (2013.01); *G01R 31/52* (2020.01); *H02H 1/0007* (2013.01); *H02H 3/021* (2013.01); *H02H 3/08* (2013.01)

(58) Field of Classification Search
None
See application file for complete search history.

(56) References Cited

U.S. PATENT DOCUMENTS

| 5,537,283 A * | 7/1996 | Keese ................. H01H 47/001 |
| | | 361/35 |
| 6,388,412 B1 * | 5/2002 | Reed ..................... E06B 9/68 |
| | | 318/266 |
| 8,213,144 B2 | 7/2012 | Papallo et al. |
| 9,256,211 B2 | 2/2016 | Meagher et al. |
| 9,563,523 B2 | 2/2017 | Fuhrman et al. |
| 2002/0145515 A1 | 10/2002 | Snowbarger et al. |
| 2018/0082813 A1 | 3/2018 | Zinser |

FOREIGN PATENT DOCUMENTS

CN 104266672 A 7/2015

OTHER PUBLICATIONS

International Search Report and Written Opinion in Corresponding PCT Application No. PCT/US2020/059663 dated Feb. 17, 2021. 12 pages.

* cited by examiner

*Primary Examiner* — Stephen W Jackson
(74) *Attorney, Agent, or Firm* — Leason Ellis LLP

(57) ABSTRACT

A system and apparatus for detecting and handling circuit faults in a field loop circuit of an industrial safety system is disclosed. The field loop circuit extends from the emergency shutdown device of the system to an instrument switch and back to an ESD input. The monitoring circuit is installed in the field loop circuit at the edge between the control and field sides of the system and is configured to detect high current events in the field loop, as distinguished from circuit conditions caused by instrument switches. If a high current event occurs, the monitoring circuit is configured to immediately isolate the field-side loop and close the control-side of the circuit by recycling a 24 VDC signal back to the monitored input of the ESD. The monitoring circuit is further configured to initiate an alarm to alert operators of the issue.

16 Claims, 4 Drawing Sheets

HIGH CURRENT DETECTION AND FIELD LOOP ISOLATION CIRCUIT

FIELD OF THE DISCLOSURE

The present disclosure is directed to industrial safety systems and, more particularly to an electrical monitoring circuit for detecting faults in the field-loop circuits of an industrial safety system and handling the fault events by isolating the field-side circuits, preventing unnecessary system shutdowns, and generating alarms.

BACKGROUND OF THE DISCLOSURE

Industrial safety systems are designed to monitor critical process parameters against low and high set-points (e.g., level, pressure, flow, vibration, temperature) through instrument switches that, upon detecting out-of-specification parameters, will open loop the electrical control circuit and cause plant or equipment shut-down. Such safety systems, however, are susceptible to unnecessary system shut-downs. These false shut-downs can contribute to production loss and unnecessary expense.

SUMMARY OF THE DISCLOSURE

According to an aspect of the present disclosure, there is provided an apparatus for preventing unnecessary system shutdown in an industrial safety system. The industrial safety system including an emergency shut down (ESD) circuit and a loop circuit. In particular, the loop circuit has an outbound leg extending from the ESD to an instrument switch, which is located in a field-side of the system. The loop circuit also includes an inbound leg returning from the instrument switch to an input of the ESD. In operation, the ESD supplies a voltage to the outbound leg of the loop circuit and monitors the voltage returned to the input of the ESD by the inbound leg of the loop circuit.

The apparatus comprises a monitoring circuit electrically connected to both the outbound leg and inbound leg of the loop circuit. In particular, the monitoring circuit includes a field-loop isolation sub-circuit configured to isolate the field loop from the ESD system. More specifically, the isolation sub-circuit includes a fuse installed in series with the loop circuit, wherein the fuse is configured to break in response to an electrical fault. The monitoring circuit further includes a supply voltage return sub-circuit which. In response to breakage of the fuse, the supply voltage return sub-circuit is configured to return the current, which is supplied by the ESD to the outbound leg of the loop circuit, back to the input of the ESD via the inbound leg of the loop circuit. The monitoring circuit also includes an alarm sub-circuit configured to, in response to breakage of the fuse, output an electrical signal indicating a fault.

According to another aspect, an industrial safety system is disclosed. The system comprises an emergency shut down (ESD) circuit and a loop circuit. In particular, the loop circuit has an outbound leg extending from the ESD to an instrument switch located in a field-side of the system and an inbound leg returning from the instrument switch to an input of the ESD. Moreover, the ESD supplies a voltage to the outbound leg and monitors the voltage returned by the inbound leg to the input.

The system further comprises a monitoring circuit electrically connected to both the outbound leg and inbound leg of the loop circuit. In particular, the monitoring circuit includes a field-loop isolation sub-circuit configured to isolate the field loop from the ESD system. More specifically, the isolation sub-circuit includes a fuse installed in series with the loop circuit, wherein the fuse is configured to break in response to an electrical fault. The monitoring circuit further includes a supply voltage return sub-circuit which. In response to breakage of the fuse, the supply voltage return sub-circuit is configured to return the current, which is supplied by the ESD to the outbound leg of the loop circuit, back to the input of the ESD via the inbound leg of the loop circuit. The monitoring circuit also includes an alarm sub-circuit configured to, in response to breakage of the fuse, output an electrical signal indicating a fault.

These and other aspects, features, and advantages can be appreciated from the accompanying description of certain embodiments of the disclosure and the accompanying drawing figures and claims.

BRIEF DESCRIPTION OF THE DRAWINGS

The foregoing and other features of the arrangements of the present disclosure will be more readily apparent from the following detailed description and drawings of an illustrative embodiment of an invention encompassed by the disclosure.

DESCRIPTION OF CERTAIN EMBODIMENTS OF THE DISCLOSURE

By way of overview and introduction, embodiments of the systems and methods disclosed herein generally concern aspects of an industrial safety systems, particularly, a fault-tolerant safety system design that incorporates an electrical monitoring circuit for detecting faults in the field-loop circuits of an industrial safety system, handling the fault events by isolating the field-side circuits, preventing unnecessary system shutdowns and generating alarms accordingly.

By way of background, industrial safety systems are designed to monitor critical process parameters against low and high setting points (e.g., level, pressure, flow, vibration, temperature) through instrument switches coupled to the safety system by respective electrical control circuits referred to as a "field-loop" circuit. The instrument switches, upon detecting out-of-specification parameters, will open loop the electrical control circuit, which causes plant or equipment shut-down. Such safety systems, however, are susceptible to unnecessary system shut-downs when electrical faults occur in the field-loop circuits that are not intentionally triggered by the process-monitoring instrument switches. These false shut-downs can contribute to production loss and unnecessary expense.

Figure 1A:
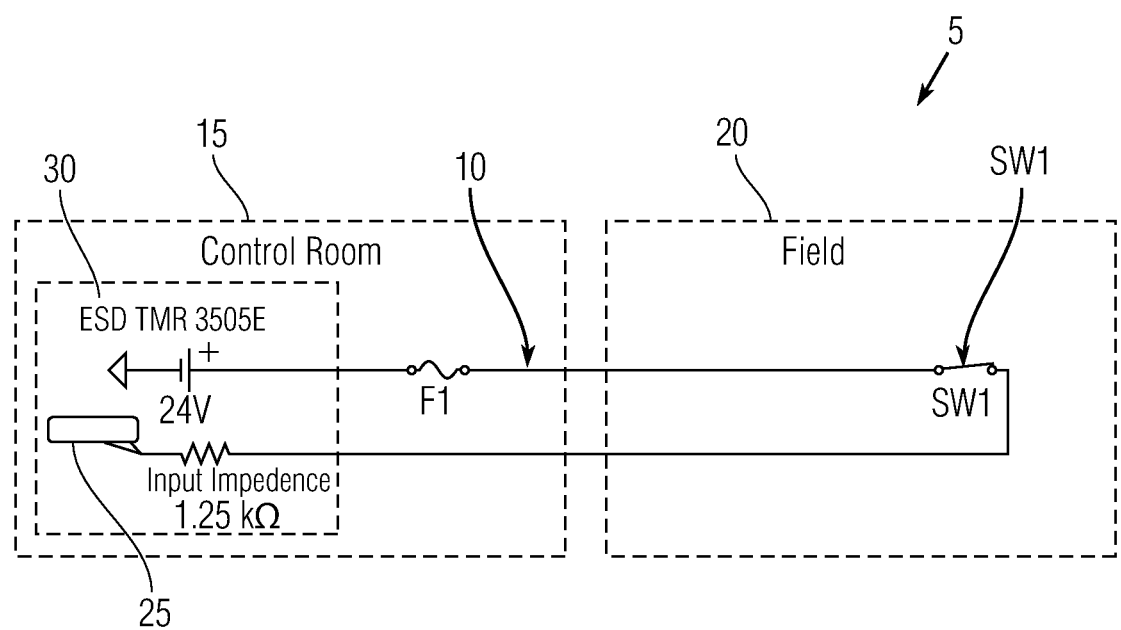
FIG. 1A is a high-level circuit diagram illustrating an industrial safety system for monitoring a field-loop circuit as is conventional in the field of emergency shut-down systems.

In general, typical industrial safety systems incorporate digital input cards (DIs) which gather individual digital loop circuits connected between a control room side of the monitoring circuit system to a field side of the monitoring circuit system. FIG. 1A is a high-level diagram of an industrial safety system 5 comprising a loop circuit 10 as would be commonly used in conventional emergency shut down (ESD) 30 and Digital Input (DI) 25 system configurations. For example, switch identified as SW1 can be level switch, pressure switch or any suitable switch that might be incorporated into a process control and monitoring system.

As shown in FIG. 1A, the safety system can be conceptually split into a control room side 15 and a field side 20, wherein a circuit loop 10 originates at the ESD system 30 in the control room 15 and runs through the field side 20 and returns back to the digital input 25 of the ESD system 30. By way of non-limiting example, each field loop in such a system, e.g., loop 10, is normally supplied with a 24 Volt DC voltage and maintains a constantly energized circuit at any point in the loop 10 as it extends from the ESD 30 through the field side 20 and back again to the control room 15. In practice, these loops might reach to hundreds of meters in length.

Figure 1B:
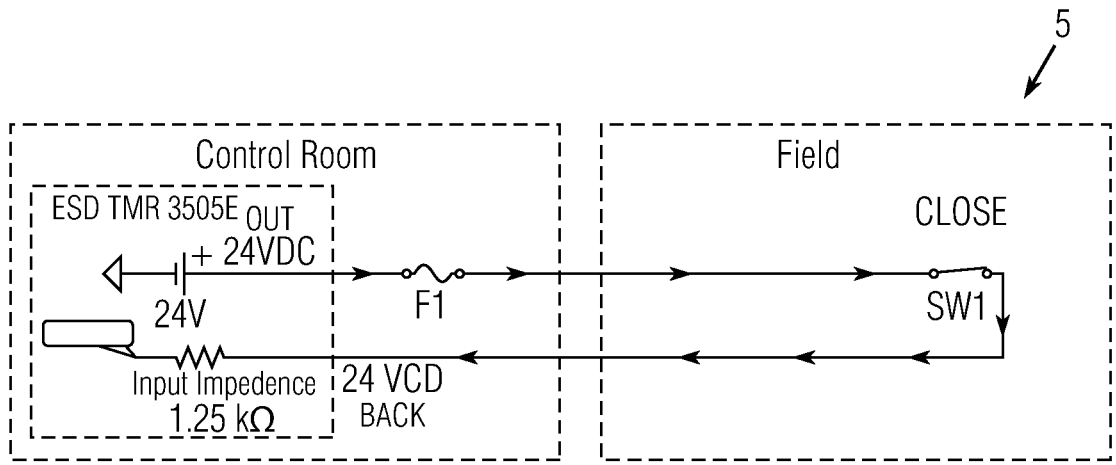
FIG. 1B is a circuit diagram of the system of FIG. 1A showing the field-loop circuit voltage response under normal operating conditions.
Figure 1C:
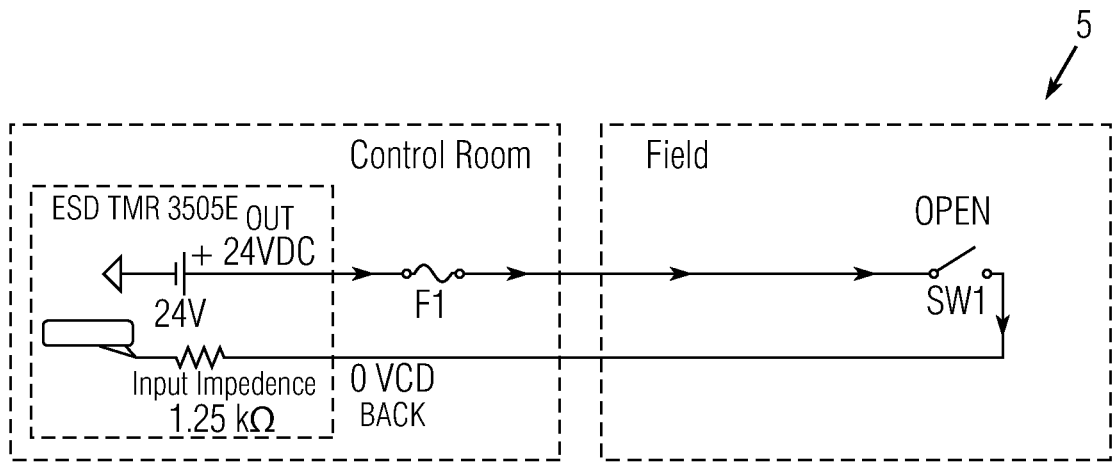
FIG. 1C is a circuit diagram of the system of FIG. 1A showing the field-loop circuit voltage response when a field-switch is opened.

In the example safety system 5, the switch SW1 is a normally closed switch. FIG. 1B illustrates the voltage through the circuit loop 10, during "healthy" or normal operation of system 5. In this situation, the field switch (SW1) is closed and, as such, the circuit has the supplied 24 VDC at any point in the loop 10. By comparison, FIG. 1C illustrates the voltage through the loop 10, in the event a critical process is upset. More specifically, in the event a critical process is upset, the instrument switch SW1 is configured to switch from closed to open, which breaks the continuous loop 10 leading to an open circuit. As a result, the supplied 24 VDC does not return to the digital input card 25 and this leads to the control system safely shutting down the equipment, as per the designed control logic of the ESD 30.

Figure 1D:
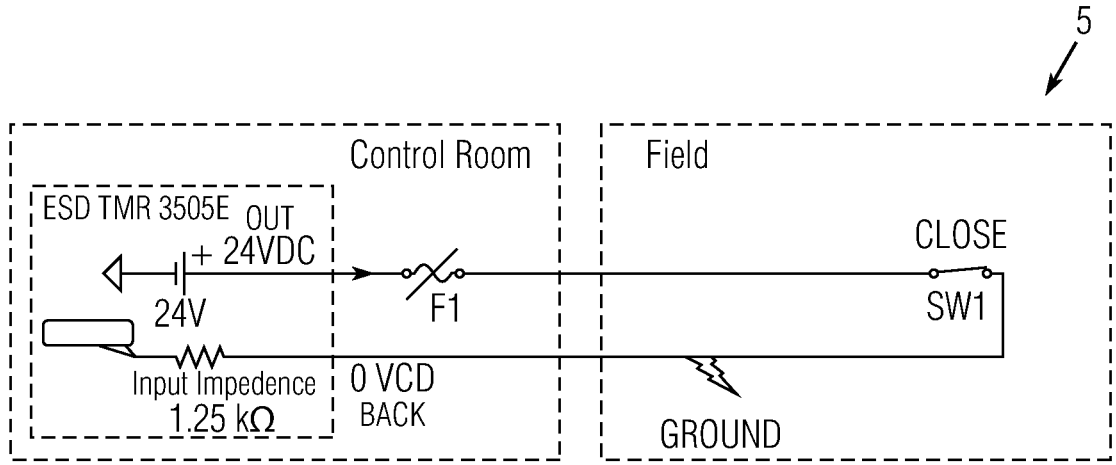
FIG. 1D is a circuit diagram of the system of FIG. 1A showing the field-loop circuit voltage response when a blown fuse causes an open circuit condition.

In some cases a circuit can be inadvertently disrupted, i.e., for reasons other than the deliberate triggering of an instrument switch. For instance, wiring issues or faults, such as a short circuit, grounded cables, blown fuses and the like, can interrupt the 24 VDC supply through the loop 10 or otherwise alter parameters of the circuit being monitored by the ESD 30. Typically, such a disruption activates the ESD shut-down procedure, leading to unnecessary system shutdown. FIG. 1C illustrates the voltage through the circuit loop 10 in the example event of an over-current condition blowing fuse F1, which leads to an open circuit loop 10. As can be appreciated, a typical ESD system 30 is not configured to differentiate between the real process upset (e.g., as shown in FIG. 1C) and faulty circuit issues (e.g., as shown in FIG. 1D) which can lead to unnecessary shut downs.

According to a salient aspect, the systems and methods disclosed herein include a monitoring circuit, which is intended to be installed in such industrial process control and safety systems such as the safety system 5 shown in FIG. 1A, configured to mitigate unnecessary shutdown events caused by unintentional circuit faults. As further described herein, the monitoring circuit is configured to monitor the loop circuit and serves to differentiate between a "real process upset" (e.g., an instrument switch triggering) and circuit failures (e.g., faulty wiring/over-current conditions) which would otherwise cause unnecessary and preferably avoided shut-downs. The monitoring circuit is intended to be installed in the control system circuit, at the edge between the control-side of the circuit and the field-side sensor circuit loops ("field loops") extending from the control-side. The monitoring circuit is configured to detect high current events in the field loops, for instance over current cause by ground wires or short circuits. In the event a high current is detected, the monitoring circuit is configured to immediately isolate the faulty field-side loop and close the control-side circuit by recycling a 24 VDC signal back to the controller monitoring the sensor loops. In certain implementations, the isolation can proceed as described in less than 100 milliseconds. This serves to prevent unnecessary shut-down. At the same time, the monitoring circuit is configured to initiate an alarm in a Distributed Control System so as to alert operators about the detected issue.

Figure 2:
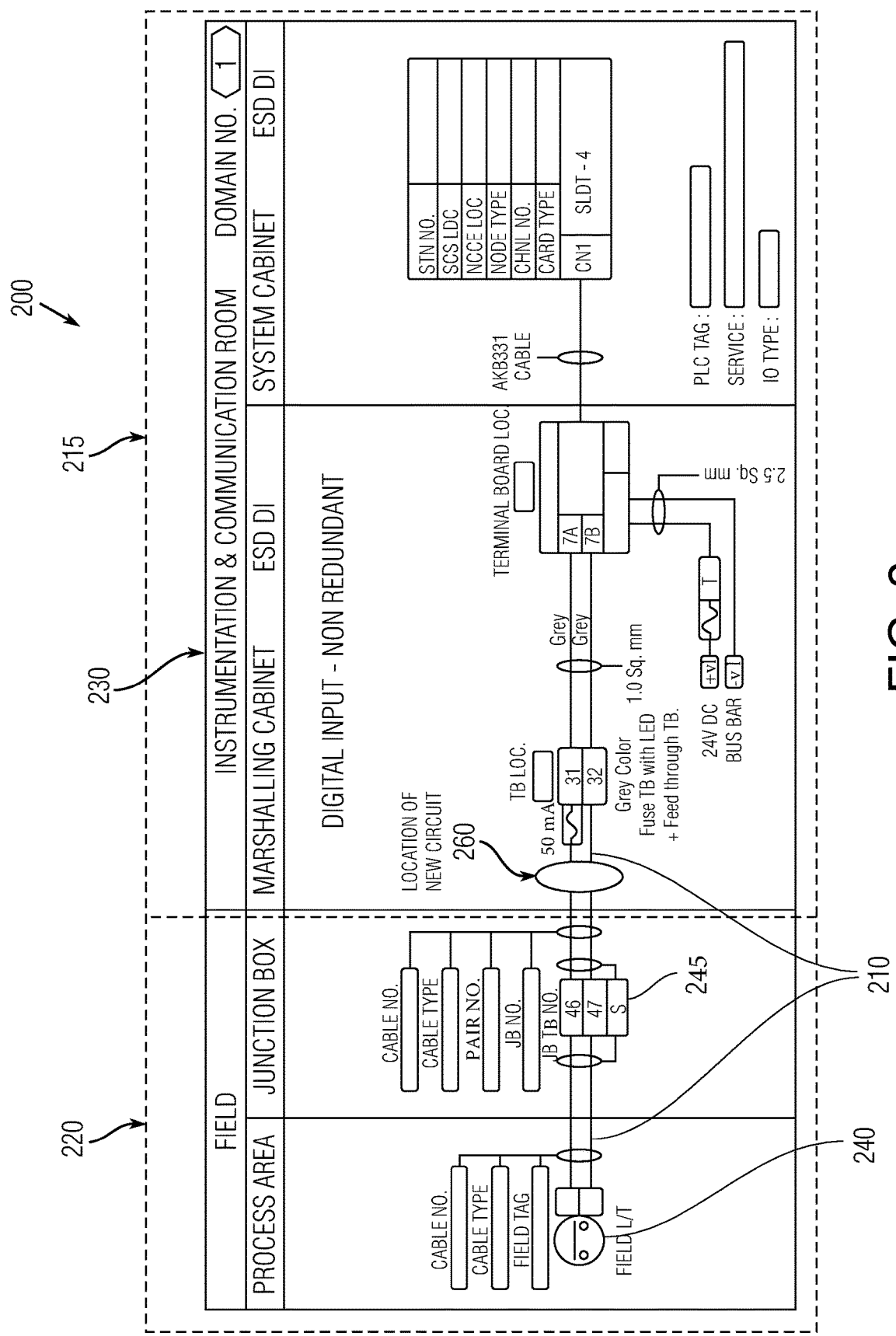
FIG. 2 is an instrument loop diagram (ILD) showing an exemplary configuration of a fault-tolerant safety system incorporating a field-loop fault monitoring circuit according to an embodiment.

Turning briefly to FIG. 2, FIG. 2 is an instrument loop diagram (ILD) showing an exemplary configuration of a safety system 205 comprising a loop circuit 210, an ESD 230, a sensor switch 240. The ILD illustrates the wire connections starting from control room side 215 (right side). As shown, the loop circuit 210 extends into the field-side 220 (left side), passing through junction boxes 245 to the instrument switch 240 and back through to the control side 215 of the circuit. Also shown is the preferred location of the monitoring circuit 260, particularly, at the edge of the control side 215 of the system 205. An exemplary configuration and operation of the monitoring circuit installed within an exemplary safety system is further described in connection with FIG. 3.

Figure 3:
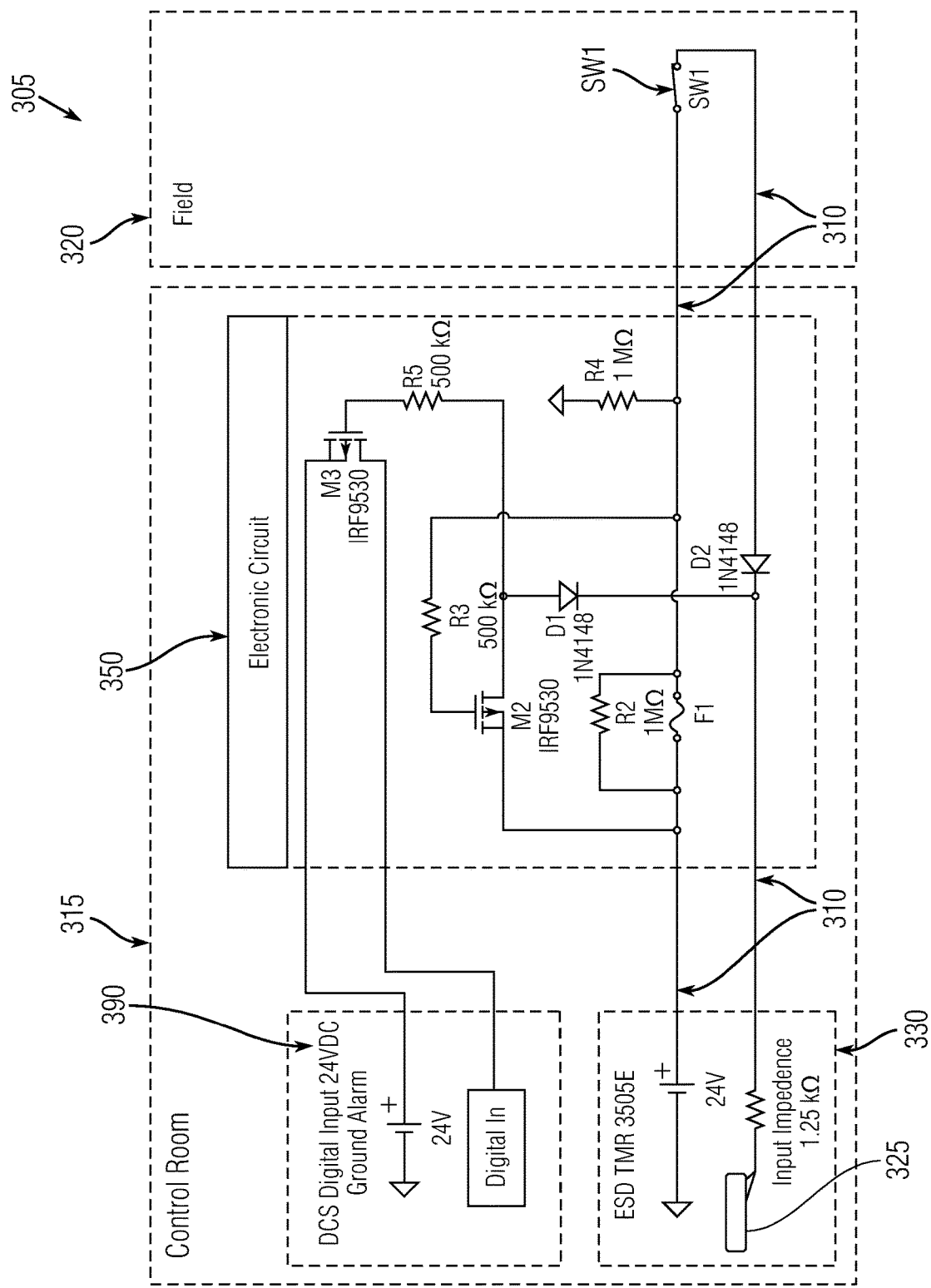
FIG. 3 is a circuit diagram illustrating exemplary configuration of a fault-tolerant safety system incorporating a field-loop fault monitoring circuit according to an embodiment.

FIG. 3 is circuit diagram showing an exemplary configuration of a safety system 305, having a similar basic design and layout as the safety system 5 of FIG. 1A, but modified to incorporate a monitoring circuit 350 in accordance with an embodiment.

As shown, the monitoring system circuit can be conceptually split into a control room side 315 and a field side 320. A circuit loop 310 originates at the ESD system 330 in the control room side 315 and extends into the field side 320 and terminates back at the digital input 325 of the ESD system. The field side of the circuit loop 310 also includes an instrument switch SW1. By way of non-limiting example, each field loop in such a system, e.g., loop 310, is normally supplied with a 24 Volt DC voltage by the ESD system 330 and is typically configured to, under normal operating conditions, maintain an energized circuit all the time at any point from the ESD 330 through the field side 320 and back again to the control room.

As shown, the monitoring circuit 350 is installed in the loop circuit 310 at the edge between the control-side 315 and the field-side 320. The monitoring circuit is configured to detect high current events occurring in the field loops, for instance an over-current caused by ground wires or short circuits. In the event of a high current, the monitoring circuit is configured to immediately, for example, within 100 milliseconds, isolate the faulty field-side loop and close the control-side circuit by recycling a 24 VDC signal back to the controller monitoring the sensor loops. In certain implementations, the isolation can proceed as described in less than 100 milliseconds. This serves to prevent unnecessary shut-down. The isolation of the field loop and the recycling of the voltage signal can be carried out by one or more of a field-loop isolation and supply voltage return sub-circuits of the monitoring circuit 350.

The monitoring circuit can also be wired to an alarm system 390, provided in the Distributed Control System for example. Accordingly, upon the occurrence of a fault, the monitoring circuit 350, particularly an alarm-sub circuit thereof, is configured to send a signal to the alarm system 390 indicating the occurrence of a fault. The signal thus causes the alarm system 390 to generate an alarm alerting operators about the detected issue.

More specifically, in one exemplary arrangement, the monitoring circuit is configured to implement the aforementioned operations as follows. The monitoring circuit comprises another fuse F1, which is introduced in series into the outbound leg of the loop 310 and thus is connected in series with the field switch SW1. F1 can be configured to break in response to a high current issue in the loop as might be caused by a short or ground wire condition. As a result, the resistance R2 in parallel with the fuse F1 will force the current from the ESD source to flow through transistor M2, which will return the current through diode D1 back to the inbound leg of the loop circuit and thus to ESD digital input 325. This effectively keeps input 325 supplied with the 24 VDC, despite the break in the loop 310 caused by the fuse, and thereby prevents the ESD 330 from immediately shutting down the system as per the designed control logic of the ESD. At the same time, M2 is configured to energize transistor M3, which sends a signal indicating the fault to an alarm device 390. This activates the alarm device thereby informing an operator that the loop 310 has been isolated and the circuit needs to be checked & repaired immediately.

In addition, the alarm device 390 can be configured to include a counter and is further configured to initiate a emergency shut-down procedure (e.g., trip the isolated equipment relating to the loop 310) after a certain time has elapsed and no action has been taken. For example, the alarm circuit can be programmed such that if the alarm is not turned off before the counter reaches a predefined count (e.g., a maximum time), the alarm device is configured to communicate a notification to the ESD sufficient to initiate shutdown.

While referred to as a "monitoring circuit" it should be appreciated that the circuit 350 is a fault detecting and fault handling circuit configured to improve and enhance the safety and monitoring functions that are ultimately performed by the ESD 330.

At this juncture, it should be noted that although much of the foregoing description has been directed to high-current detection and field-loop isolation circuits used in industrial monitoring and safety systems, the systems and methods disclosed herein can be similarly deployed and/or implemented in scenarios, situations, and settings far beyond the referenced scenarios. It is to be understood that like numerals in the drawings represent like elements through the several figures, and that not all components and/or steps described and illustrated with reference to the figures are required for all embodiments or arrangements.

Thus, illustrative embodiments and arrangements of the present systems and methods provide a system, processes and computer implemented control methods, computer system, and computer program product for fault detecting and fault handling in an industrial monitoring and safety system. The flowchart and block diagrams in the figures illustrate the architecture, functionality, and operation of possible implementations of systems, methods and computer program products according to various embodiments and arrangements. In this regard, each block in a flowchart or block diagrams as it relates to a computer implemented method can represent a module, segment, or portion of code, which comprises one or more executable instructions for implementing the specified logical function(s).

It should also be noted that, in some alternative implementations, the functions described herein or noted in a block diagram may occur out of the order noted. For example, two blocks or operations shown or described in succession may, in fact, be executed substantially concurrently, or may sometimes be executed in the reverse order, depending upon the functionality involved. It will also be noted that functional blocks or operations can, where applicable, be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The subject matter described above is provided by way of illustration only and should not be construed as limiting. Various modifications and changes can be made to the subject matter described herein without following the example embodiments and applications illustrated and described, and without departing from the true spirit and scope of the invention encompassed by the present disclosure, which is defined by the set of recitations in the following claims and by structures and functions or steps which are equivalent to these recitations.

What is claimed is:

1. An apparatus for preventing unnecessary system shutdown in an industrial safety system including an emergency shut down (ESD) circuit and a loop circuit, the loop circuit having an outbound leg extending from the ESD to an instrument switch located in a field-side of the system and an inbound leg returning from the instrument switch to an input of the ESD, wherein the ESD supplies a voltage to the outbound leg and monitors the voltage returned by the inbound leg to the input, the apparatus comprising:

a monitoring circuit electrically connected to both the outbound leg and inbound leg of the loop circuit, the monitoring circuit including:

a field-loop isolation sub-circuit configured to isolate the field loop from the ESD system, the isolation sub-circuit having a fuse installed in series with the loop circuit, wherein the fuse is configured to break in response to an electrical fault, a supply voltage return sub-circuit wherein, in response to breakage of the fuse, the supply voltage return sub-circuit is configured to return a current supplied by the ESD to the outbound leg of the loop circuit back to the input of the ESD via the inbound leg of the loop circuit, and an alarm sub-circuit configured to, in response to breakage of the fuse, output an electrical signal indicating a fault.

2. The apparatus of claim 1, wherein the monitoring circuit is installed in the loop circuit at an edge between a control-side of the system and a field-side of the system.

3. The apparatus of claim 1, wherein the fuse is configured to break in response to high current events in the field loop.

4. The apparatus of claim 1, wherein the monitoring circuit further comprises a resistor connected in parallel with the fuse.

5. The apparatus of claim 4, wherein the in-parallel resistor is configured to, in response to the fuse breaking, direct current to flow through a transistor of the supply voltage return sub-circuit and back to the digital input.

6. The apparatus of claim 5, wherein the current directed to flow through the transistor of the supply voltage return sub-circuit further energizes a second transistor of the alarm sub-circuit configured to output the electrical signal indicating a fault.

7. The apparatus of claim 1, further comprising:
an alarm device electrically connected to the alarm sub-circuit, wherein the alarm device is configured to generate an alarm in response to receipt of the electrical signal indicating a fault.

8. The apparatus of claim 7, wherein the alarm device further comprises a counter triggered by receipt of the electrical signal indicating a fault, and wherein the alarm device is configured to initiate an emergency shut-down procedure after the counter reaches a prescribed count.

9. An industrial safety system, comprising:
an emergency shut down (ESD) circuit;
a loop circuit, the loop circuit having an outbound leg extending from the ESD to an instrument switch located in a field-side of the system and an inbound leg returning from the instrument switch to an input of the ESD, wherein the ESD supplies a voltage to the outbound leg and monitors the voltage returned by the inbound leg to the input; and
a monitoring circuit electrically connected to both the outbound leg and inbound leg of the loop circuit, the monitoring circuit including:
a field-loop isolation sub-circuit configured to isolate the field loop from the ESD system, the isolation sub-circuit having a fuse installed in series with the loop circuit, wherein the fuse is configured to break in response to an electrical fault,
a supply voltage return sub-circuit wherein, in response to breakage of the fuse, the supply voltage return sub-circuit is configured to return a current supplied by the ESD to the outbound leg of the loop circuit back to the input of the ESD via the inbound leg of the loop circuit, and
an alarm sub-circuit configured to, in response to breakage of the fuse, output an electrical signal indicating a fault.

10. The system of claim 9, wherein the monitoring circuit is installed in the loop circuit at an edge between a control-side of the system and a field-side of the system.

11. The system of claim 9, wherein the fuse is configured to break in response to high current events in the field loop.

12. The system of claim 9, wherein the monitoring circuit further comprises a resistor connected in parallel with the fuse.

13. The system of claim 12, wherein the in-parallel resistor is configured to, in response to the fuse breaking, direct current to flow through a transistor of the supply voltage return sub-circuit and back to the digital input.

14. The system of claim 13, wherein the current directed to flow through the transistor of the supply voltage return sub-circuit further energizes a second transistor of the alarm sub-circuit configured to output the electrical signal indicating a fault.

15. The system of claim 9, further comprising:
an alarm device electrically connected to the alarm sub-circuit, wherein the alarm device is configured to generate an alarm in response to receipt of the electrical signal indicating a fault.

16. The system of claim 15, wherein the alarm device further comprises a counter triggered by receipt of the electrical signal indicating a fault, and wherein the alarm device is configured to initiate an emergency shut-down procedure after the counter reaches a prescribed count.

* * * * *